(12) United States Patent
Wu

(10) Patent No.: US 12,027,379 B2
(45) Date of Patent: Jul. 2, 2024

(54) PACKAGE SUBSTRATE AND METHOD OF FORMING THE SAME, PACKAGE STRUCTURE AND METHOD OF FORMING THE SAME

(71) Applicant: CHANGXIN MEMORY TECHNOLOGIES, INC., Hefei (CN)

(72) Inventor: Ping-Heng Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 367 days.

(21) Appl. No.: 17/433,789

(22) PCT Filed: Nov. 12, 2020

(86) PCT No.: PCT/CN2020/128342
§ 371 (c)(1),
(2) Date: Aug. 25, 2021

(87) PCT Pub. No.: WO2021/164337
PCT Pub. Date: Aug. 26, 2021

(65) Prior Publication Data
US 2022/0351984 A1 Nov. 3, 2022

(30) Foreign Application Priority Data

Feb. 19, 2020 (CN) .......................... 202010102444.1

(51) Int. Cl.
*H01L 21/00* (2006.01)
*H01L 21/56* (2006.01)
(Continued)

(52) U.S. Cl.
CPC .......... *H01L 21/565* (2013.01); *H01L 21/563* (2013.01); *H01L 23/13* (2013.01);
(Continued)

(58) Field of Classification Search
CPC ............................................. H01L 2924/15151
See application file for complete search history.

(56) References Cited

U.S. PATENT DOCUMENTS 5,581,038 A * 12/1996 Lampropoulos .... G01L 19/0023
73/756
6,239,385 B1 * 5/2001 Schwiebert .......... H05K 1/0222
439/63
(Continued)

FOREIGN PATENT DOCUMENTS

CN 203590586 U 5/2014
CN 105914155 A 8/2016
(Continued)

OTHER PUBLICATIONS

International Search Report dated Jan. 28, 2021 for Application No. PCT/CN2020/128342.
(Continued)

*Primary Examiner* — Nicholas J Tobergte
(74) *Attorney, Agent, or Firm* — Kilpatrick Townsend & Stockton LLP

(57) ABSTRACT

The present disclosure relates to a package substrate comprising: a substrate having opposing first surface and second surface; at least one vent hole extending through the first surface and the second surface of the substrate, the vent hole comprising at least a long-strip hole.

18 Claims, 8 Drawing Sheets

(51) Int. Cl.
  *H01L 23/13* (2006.01)
  *H01L 23/31* (2006.01)
  *H01L 23/00* (2006.01)

(52) U.S. Cl.
  CPC .......... *H01L 23/3128* (2013.01); *H01L 24/16* (2013.01); *H01L 2224/16225* (2013.01); *H01L 2924/15151* (2013.01)

(56) References Cited

U.S. PATENT DOCUMENTS

| | | | |
|---|---|---|---|
| 6,383,846 B1 | 5/2002 | Shen et al. | |
| 6,617,682 B1 * | 9/2003 | Ma | H01L 23/3677 |
| | | | 257/E23.101 |
| 2001/0042908 A1 * | 11/2001 | Okada | H01L 23/13 |
| | | | 257/E21.503 |
| 2002/0092162 A1 | 7/2002 | Tsai et al. | |
| 2002/0095192 A1 * | 7/2002 | Pu | H01L 24/28 |
| | | | 257/E21.503 |
| 2003/0111734 A1 * | 6/2003 | Kobayashi | H01L 23/5383 |
| | | | 257/E23.06 |
| 2011/0193228 A1 | 8/2011 | Yu et al. | |
| 2014/0008795 A1 | 1/2014 | Kim et al. | |
| 2014/0117543 A1 * | 5/2014 | Park | H01L 23/13 |
| | | | 257/738 |
| 2016/0278193 A1 * | 9/2016 | Chen | H05F 3/00 |

FOREIGN PATENT DOCUMENTS

| | | |
|---|---|---|
| CN | 209419980 U | 9/2019 |
| CN | 211404481 U | 9/2020 |
| GB | 2504343 A | 1/2014 |
| JP | H03157944 A | 7/1991 |
| JP | 2003017625 A | 1/2003 |
| WO | 2014030760 A1 | 2/2014 |

OTHER PUBLICATIONS

Extended European Search Report dated Jun. 8, 2022 for Application No. EP 20919808.4.

"How to Cut Slots in Wood: 9 Steps (with Pictures)—wikiHow", Oct. 21, 2021 (Oct. 21, 2021), pp. 1-4, XP055924284, Retrieved from the Internet: URL:https://www.wikihow.com/Cut-Slots-in-Wood.

* cited by examiner

PACKAGE SUBSTRATE AND METHOD OF FORMING THE SAME, PACKAGE STRUCTURE AND METHOD OF FORMING THE SAME

CROSS-REFERENCE TO RELATED APPLICATIONS

The present disclosure is an application under 35 U.S.C. 371 of International Application No. PCT/CN2020/128342 filed on Nov. 12, 2020, which claims priority to the Chinese Patent Application No. 202010102444.1, filed on Feb. 19, 2020, entitled "Package Substrate and Method of Forming the Same, Package Structure and Method of Forming the Same", the entire contents of each of which are incorporated herein by reference.

TECHNICAL FIELD

The present disclosure relates to the field of semiconductor technology, in particular to a package substrate and a method of forming the same, a package structure and a method of forming the same.

BACKGROUND

After the chip is packaged, the chip is protected by wrapping the packaged chip through injection molding.

For chips packaged by Flip chip, connections are made between the chip and the substrate through solder balls to connect the chip to circuits on the substrate. The molding process requires a mold compound to wrap the entire chip, filling the gap between the chip and the substrate. Because the gaps are small and the separation distance between the connection points is small due to direct connection between the chip and the substrate via solder balls or other solder bumps, the mold compound is less prone to air evacuation when filled and is prone to unreliable package structures.

In the prior art, to facilitate gas venting during injection molding, air holes are provided on the package substrate so that as the mold compound is filled, gas is vented from the air holes on the substrate during injection molding, thereby increasing the filling effect of the mold compound fluid and reducing the phenomena such as unfilled air holes and Wire sweep. However, existing chips are typically designed in non-square dimensions, and a single vent hole tends to achieve the desired effect in the direction of the short side of the chip, whereas in the direction of the long side of the chip it tends to be difficult to achieve the desired effect, there are still more air holes and the mold compound filling effect is poor, affecting the reliability of the product.

How to further enhance the filling effect of the mold compound in the injection molding process is a problem that is urgently addressed.

SUMMARY

The present disclosure provides a package substrate comprising: a substrate having opposing a first surface and a second surface; at least one vent hole extending through the first surface and the second surface of the substrate, the vent hole comprising at least a long-strip hole.

Particular embodiments of the present disclosure also provide a method of forming a package substrate, comprises: providing a substrate having a first surface and a second surface; forming at least one vent hole extending through the first surface and the second surface of the substrate, the vent hole including at least a long-strip hole.

An aspect of the present disclosure also provides a package structure comprising: a package substrate as described in any of the above; a chip flip-chip fixed to a first surface of the substrate with solder bumps, the vent hole being located within a projection of the chip on the substrate by forming electrical connections between the solder bumps and the substrate; a mold compound enclosing the chip and filling a gap between the chip and the first surface of the substrate and the vent hole.

An aspect of the present disclosure also provides a method of forming a package structure, comprising: providing a package substrate as described in any of the above; flip-chip fixing a chip to a first surface of the substrate with solder bumps by a flip-chip process, the vent hole within the substrate being located within a projection of the chip on the substrate by forming electrical connections between the solder bumps and the substrate; performing a injection molding process of the chip flip-chip onto the substrate, enclosing the chip and filling a gap between the chip and the first surface of the substrate and the vent holes with a mold compound.

DESCRIPTION OF EMBODIMENTS

As described in the background, air holes in prior art are formed on the substrate to facilitate gas venting in the short side direction of the chip during injection molding and to improve the filling effect of the mold compound in the short side direction. However, in the direction of the long side of the chip, there is still a problem of filling such as bubbles.

The inventors have found that in the direction of the long side of the chip, a more pronounced peristaltic flow (Re«1 in fluid mechanics, or low Reynolds number flow) is generated as the mold compound needs to flow through more solder bump areas, resulting in turbulent influx of the mold compound containing more air bubbles and thus poor venting effect through a single circular hole; This problem can be ameliorated by arranging more air holes in the direction of the long side of the chip, however, more air holes will occupy the area of the soldering region between the chip and the substrate, so that the soldering region is dispersed and design area is wasted.

Figure 1:
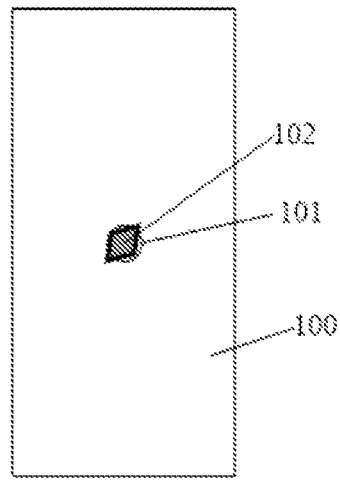
FIG. 1 is a schematic view of a gas hole on a substrate being blocked by impurities.

The inventors have further discovered that air holes in prior art are provided in a circular shape, it will be difficult for the mold compound to pass through when solid or semi-solid impurities are contained in the mold compound, or the mold compound may cause the air holes to become blocked, resulting in more serious filling abnormalities. Referring now to FIG. 1, where the substrate 100 is centrally provided with a gas hole 101, impurities 102 in the mold compound that are larger or comparable to the diameter of the gas hole 101 are difficult to escape or detach from the gas hole 101 regardless of how the impurities 102 change position, are very prone to getting stuck within the gas hole 101, resulting in gas that cannot be removed. While hole apertures can be expanded directly to ameliorate problems such as air bubbles and clogging, the solder bumps of the chip and the soldering region of the substrate are also excessively occupied, and the mold compound can droop directly from the hole with large diameter, resulting in unfilled mold compound filling in the area around the hole.

Based on the above studies, the inventors propose a new package substrate and a method for forming the same, and a package structure based on the package substrate and a method for forming the same, to solve the above-described problems.

Specific embodiments of package substrates and methods of forming the same, package structures and methods of forming the same provided herein are described in detail below with reference to the accompanying drawings.

Figure 2A:
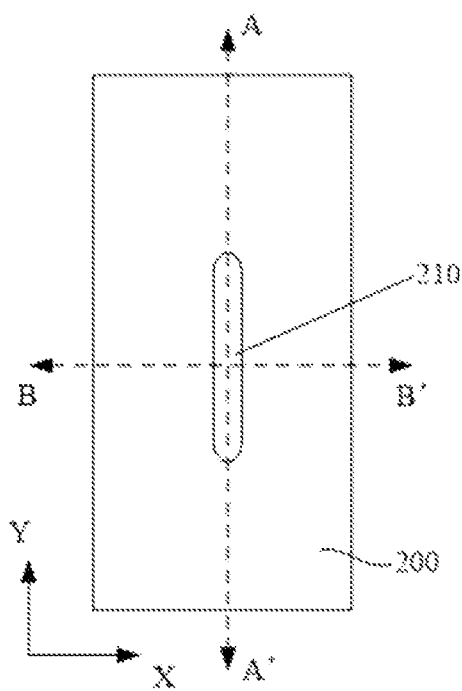
FIGS. 2a to 2e are structural diagrams of a package substrate according to an embodiment of the disclosure.
Figure 2B:
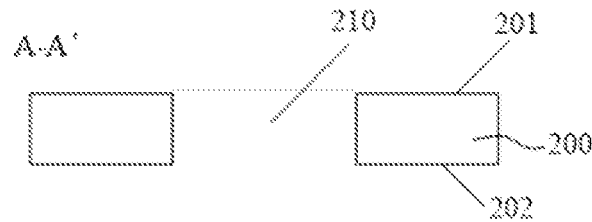
Figure 2C:
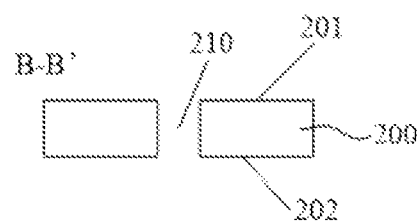

Referring now to FIGS. 2a-2c, schematic illustrations of a package substrate in accordance with an embodiment of the present disclosure are shown. FIG. 2a is a schematic top view of the substrate 200, FIG. 2b is a schematic cross-sectional view along secant AA' in FIG. 2a and FIG. 2c is a schematic cross-sectional view along secant BB' in FIG. 2a.

The package substrate includes a substrate 200, and a vent hole 210 through the substrate 200.

The substrate 200 has opposing first surface 201 and second surface 202. The substrate 200 may be a circuit board having electrical connection structure like interconnect circuitry, pads, etc. formed on the surface of the substrate 200 and/or within the substrate 200, for making electrical connections to the chip, inputting electrical signals to the chip, or outputting electrical signals generated by the chip. The shape of the substrate 200 generally corresponds to the shape of the chip to be packaged, being square or rectangular. In this embodiment, the substrate 200 has a rectangular shape with a length along the Y direction and a width along the X direction.

The vent hole 210 is a long-strip hole extending through the first surface 201 and the second surface 202 of the substrate 200. The region of the first surface 201 of the substrate 200 outside of the vent hole 210 is a soldering region, with a metal connection layer formed for soldering with the chip to be packaged. In other embodiments, the vent hole 210 includes at least one long-strip hole, and other hole structures in communication with the long-strip hole. In this embodiment, the vent hole 210 is in the shape of long straight lines, in other embodiments, the vent hole 210 may also be broken line or curved lines, and in particular the vent hole may be shaped according to the distribution of the solder bumps. While increasing the venting effect, by avoiding overly dispersed soldered regions on the substrate 200, the waste of area can be reduced.

When the vent hole 210 has a long-strip shape, the aperture area is larger and the venting effect is better; and, if solid or semi-solid impurities are contained within the mold compound, the impurities are less likely to get stuck within the vent hole with the following of the mold compound, thereby reducing instances of the vent hole 210 becoming blocked. Also, even if the impurities get stuck inside the vent hole 210, gas can be vented from both sides of the impurities because the vent hole 210 has the long-strip shape, thereby preventing the possibility of the vent holes being completely blocked.

In this embodiment, the length direction of the vent hole 210 coincides with the length direction of the substrate 200. Since the mold compound flows a longer distance in the Y-axis direction of the substrate 200 during the injection molding process, more solder bumps are passed through, the vent hole 210 has a longer length in the Y-direction, which can improve the venting effect in the Y-direction. And the vent hole 210 is disposed along the axis of symmetry of the substrate 200, and is symmetric about the axis of symmetry. Since the mold compound typically flows from the edge to the center of the substrate 200 during the injection molding process, the vent hole 210 being provided at the position of axis of symmetry may improve the uniformity of the venting.

The width to length ratio of the vent hole 210 ranges from 1:1.3 to 1:15 for a better venting effect. Preferably, the width to length ratio of the vent hole 210 ranges from 1:2 to 1:7 to provide a better venting effect and avoid occupying a large substrate area.

In other embodiments, two or more vent holes may also be formed within the substrate 200.

Figure 3:
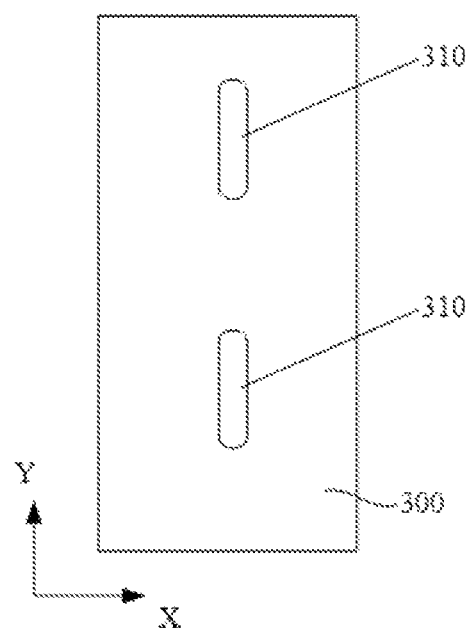
FIG. 3 is a schematic illustration of a structure of a package substrate in accordance with an embodiment of the present disclosure.

Referring now to FIG. 3, a schematic top view of a package substrate in accordance with another embodiment of the present disclosure is shown. In this embodiment, two vent holes 310 are formed in the substrate 300, each of which is a long-strip hole, the length direction of the vent holes 310 coincides with the length direction of the substrate 300 and the vent holes are distributed along the axis of symmetry.

Figure 4A:
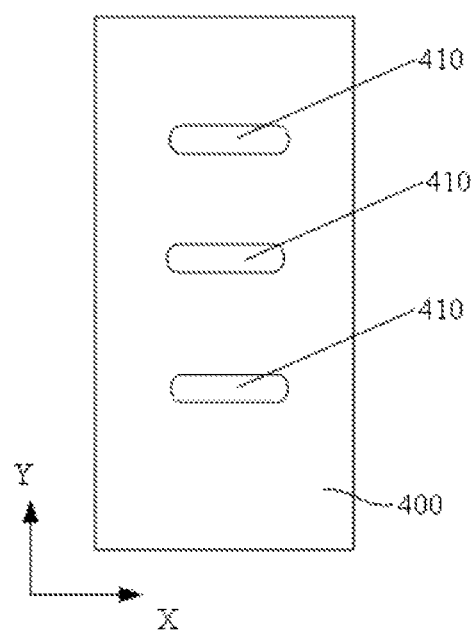
FIG. 4a is a schematic illustration of a structure of a package substrate in accordance with an embodiment of the present disclosure.

Referring now to FIG. 4a, there is a schematic top view of a package substrate in accordance with another embodiment of the present disclosure. In this embodiment, three vent holes 410 are formed in the substrate 400, the length directions of the vent holes 410 may coincide with the width direction of the substrate 300, and the vent holes are uniformly distributed along the width direction of the substrate 400.

Figure 4B:
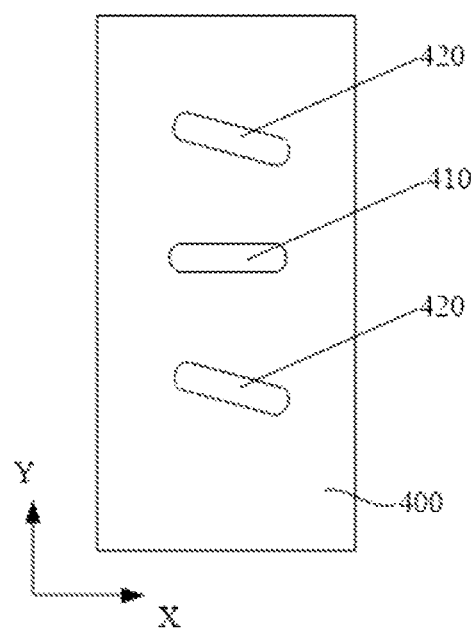
FIG. 4b is a schematic illustration of a structure of a package substrate according to an embodiment of the disclosure.

Referring now to FIG. 4b, there is a schematic top view of a package substrate according to another embodiment wherein two vent holes 420 are arranged obliquely.

In other embodiments, the number and distribution of the vent holes 410, 420 on the substrate 200 can be set properly based on the distribution of the soldering region on the substrate 200 and simulated effects of the flow rate of the mold compound fluid, etc. The length to width ratio of the long-strip holes of the vent holes 410, 420 is 1:1.3 to 1:15, which has a better effect of venting and avoiding clogging by impurities.

In other embodiments, the substrate may also have at least one circular hole formed through the first surface and the second surface of the substrate. The circular holes may be distributed across a central axis of the substrate, preferably, distributed on a central axis along the length direction of the substrate.

Figure 5:
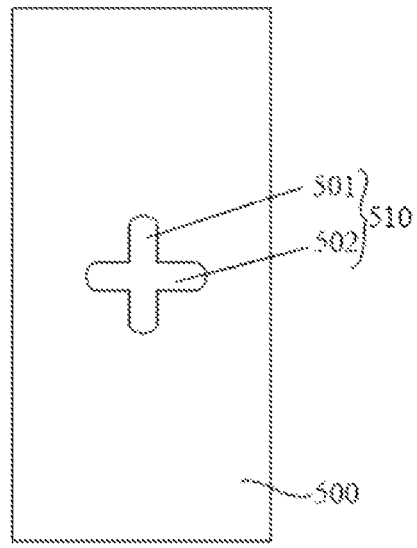
FIG. 5 is a structural diagram of a package substrate in accordance with an embodiment of the present disclosure.

Referring now to FIG. 5, a schematic top view of a package substrate in accordance with another embodiment of the present disclosure is shown.

In this embodiment, the vent holes 510 in the substrate 500 include two cross-connected long-strip holes 510 and 520, in a crisscross shape. In this embodiment, the sizes of the hole 501 and the hole 502 are the same, and the length directions of the holes coincide with the length and width directions of the substrate 500, respectively. And the hole 510 is located at a central position of the substrate 500. In another embodiment, the sizes of the hole 501 and the hole 502 may also be different, preferably the length of the hole 501 extending along the long side of the substrate 500 is greater than the length of the hole 502 extending along the short side of the substrate 500.

In other embodiments, the vent hole may further comprise three or more cross-connected long-strip holes, the cross angles may be perpendicular or oblique to each other, and the cross locations may be located in the middle or in the ends, without being limited here.

With continued reference to FIG. 2a, the vent hole 210 has a smooth inner wall edge. In particular, the cross-sectional edge of the vent hole 210 parallel to the surface of the substrate 200 has smooth lines, and has an arc connect at the position of the corner of the length connecting the width to avoid sharp corner inside the vent hole 210 causing turbulent flow when the gas or fluid passing through, thereby affecting the filling effect of the mold compound. The vent hole 210 may be formed by drilling, laser etching, etching, or the like. Further, the inner wall surface of the vent hole 210 may also be passivated so that the inner wall surface of the vent hole 210 has a passivation surface to ensure that the vent hole 210 has a smooth inner wall edge. The passivation surface may be a passivation layer surface covering the sidewall of the vent hole 210.

Figure 2D:
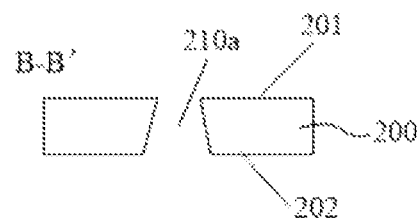
Figure 2E:
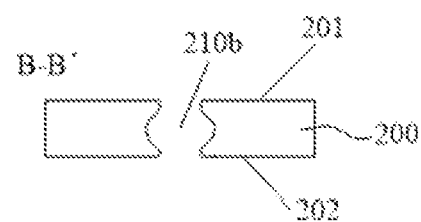

In this embodiment, the sidewall of the vent hole 210 is perpendicular to the surface of the substrate 200. In other embodiments, the vent hole 210 may also have a sloped side wall (please refer to vent hole 210a in FIG. 2d), or a side wall having a larger middle dimension and two smaller ends (please refer to vent hole 210b in FIG. 2e), without being limited here.

Figure 6:
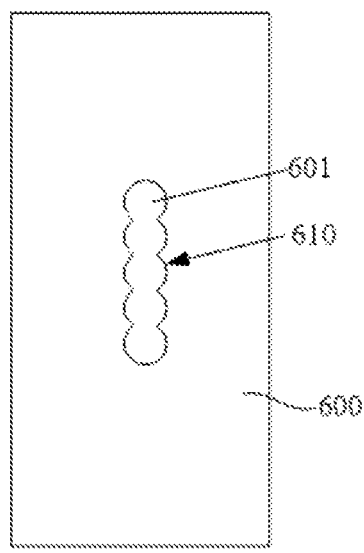
FIG. 6 is a structural diagram of a package substrate in accordance with an embodiment of the present disclosure.

Referring now to FIG. 6, a schematic top view of a package substrate in accordance with an embodiment of the present disclosure is shown.

The vent hole 610 within the package substrate 600 is formed by connecting a plurality of continuous circular holes 601. The size of each of the circular holes 601 is the same, and the size and shape of the vent hole 610 can be adjusted by controlling the number and arrangement of the circular holes 601, and the adjustment is easy to be realized.

In this embodiment, the vent hole 610 is connected by circular holes, with a protruding sharp corner where the edges of adjacent circular holes meet, so that the smoothness of the vent hole 610 is to be improved.

Figure 7:
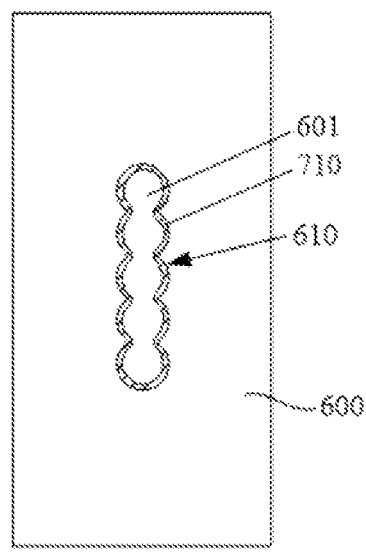
FIG. 7 is a structural diagram of a package substrate in accordance with an embodiment of the present disclosure.

Referring now to FIG. 7, there is a schematic illustration of a package substrate in accordance with another embodiment of the present disclosure.

On the basis of the package substrate shown in FIG. 6, a passivation layer 710 is formed on the inner wall surface of the vent hole 610. By passivation layer 710, the angle of the protruding sharp corner of the inner wall of the vent hole 610 becomes flat, and the surface of the vent hole 610 becomes arc-shaped, reducing the risk of turbulent flow when the gas or fluid passing through the vent hole 610.

The passivation layer 710 may be formed by a metallization process. In some embodiments, the passivation layer 710 may be a metal layer formed by a sputtering process, such as a Cu layer, a W layer, or the like.

In other embodiments, the passivation layer 710 may also be formed on the inner wall surface of the vent hole 610 by chemical deposition. The passivation layer 710 may also be formed from other materials that tend to cover the inner wall of the vent hole.

In other embodiments, the inner wall of the vent hole 610 may also be smoothed to remove sharp corners by grinding the inner wall of the vent hole 610, such that there is no sharp protrusion one the inner wall of the vent hole 610.

The package substrate in the above detailed description, having long-strip vent holes, can increase the venting effect and reduce the risk of the vent holes being blocked during injection molding. Also, while increasing the venting effect, the number of vent holes is reduced so that the soldering region between the substrate and the chip is more concentrated, avoiding wasting design area.

Embodiments of the present disclosure also provide a structural schematic of the above-described formation process of the package substrate.

Take the package substrate shown in FIG. 2a as an example.

First, a substrate 200 is provided having opposing first surface 201 and second surface 202. The substrate 200 may be a circuit board having electrical connection structure like interconnect circuitry, pads, etc. formed on the surface of the substrate 200 and/or within the substrate 200, so that the substrate 200 may be electrically connected to the chip, inputting electrical signals to the chip or outputting electrical signals generated by the chip. The shape of the substrate 20M generally corresponds to the shape of the chip to be packaged, being square or rectangular.

A vent hole 210 is then formed within the substrate 200, extending through the first surface 201 and the second surface 202 of the substrate 200, the vent hole 210 is a long-strip hole.

The region of the first surface 201 of the substrate 200 outside of the vent hole 210 is a soldering region, with a metal connection layer formed for soldering with the chip to be packaged. In other embodiments, the vent hole 210 includes at least one long-strip hole, and other hole structures in communication with the long-strip hole. In this embodiment, the vent hole 210 is in the shape of long straight lines, and in other embodiments, the vent hole 210 may also be broken lines or curved lines. While increasing the venting effect, by avoiding overly dispersed the soldering regions on the substrate 200, the waste of area can be reduced.

In this embodiment, the length direction of the vent hole 210 coincides with the length direction of the substrate 200. In other embodiments, the length direction of the vent hole 210 may also coincide with the width direction of the substrate 200, or may be arranged obliquely.

In other embodiments, two or more vent holes may also be formed within the substrate 200. The vent hole also includes two or more cross-connected long-strip holes.

The length to width ratio of the long-strip hole is 1:1.3 to 1:15, preferably 1:2 to 1:7.

In other embodiments, the substrate may also have at least one circular hole formed through the first surface and the second surface of the substrate. The circular holes may be distributed on a central axis of the substrate, preferably, distributed on a central axis along the length direction of the substrate.

The numbers, locations, shapes, and sizes of the vent holes formed can be reasonably set as desired by those skilled in the art, without being limited here.

Figure 8A:
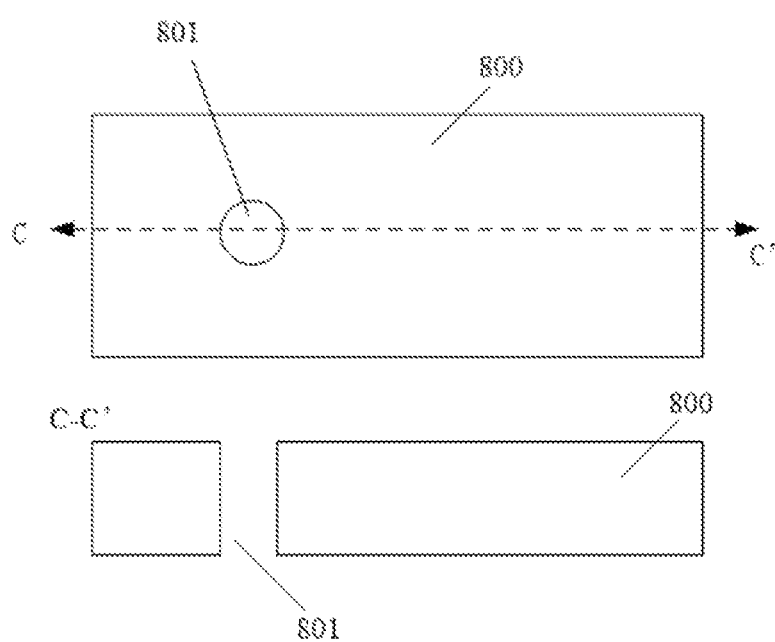
FIGS. 8a-8c are structural schematic views of a package substrate according to an embodiment of the disclosure.
Figure 8B:
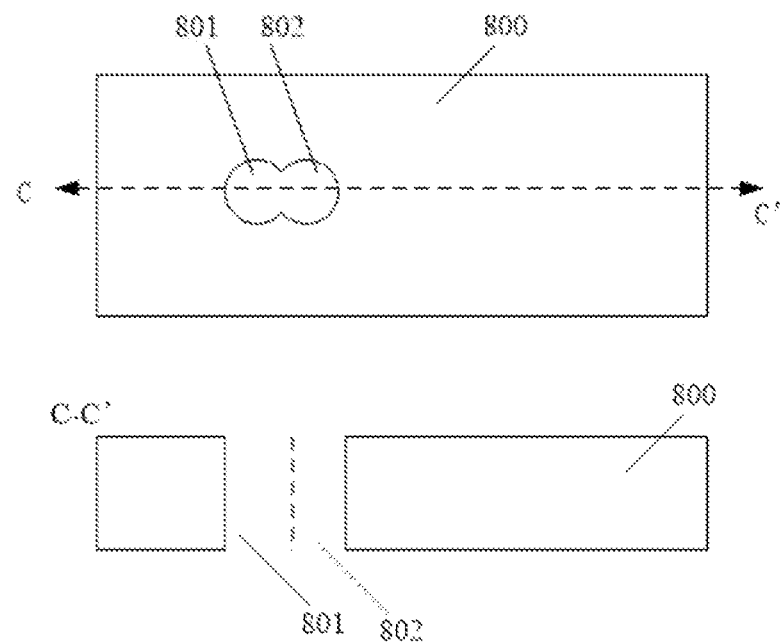
Figure 8C:
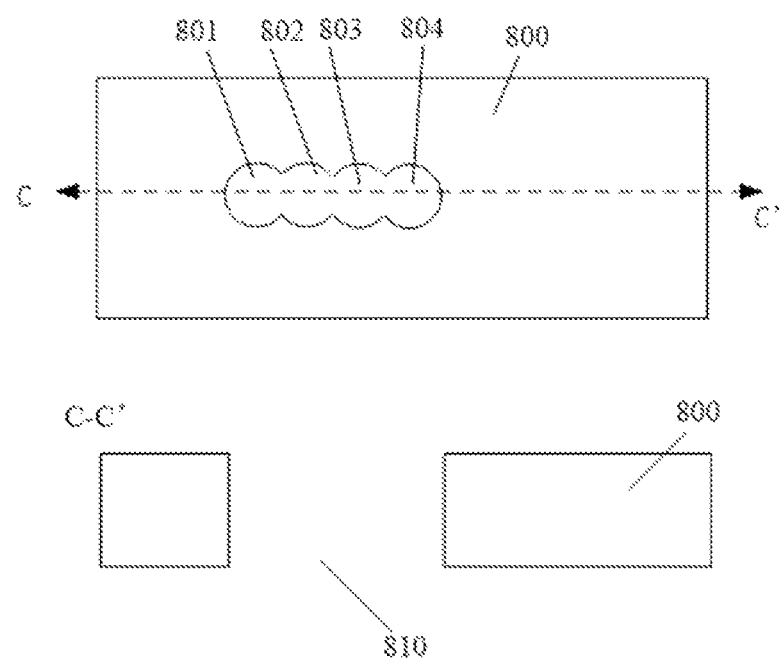

Referring now to FIGS. 8*a* to 8*c*, schematic illustrations of the vent hole formation process are shown in accordance with an implementation of the disclosure.

Referring now to FIG. 8*a*, a circular hole 801 is formed on the substrate 800. FIG. 8*a* includes a schematic top view of the circular hole 801 formed by drilling, and a schematic cross-sectional view along secant lines CC in the schematic top view;

Referring to FIG. 8*b*, a circular hole 802 of the same size is formed by drilling on the edge of the circular hole 801, with an overlap between the circular hole 802 and the circular hole 801 such that the circular hole 802 communicates with the circular hole 801.

Referring to FIG. 8*c*, circular hole 803 and circular hole 804 are continuously formed along the same straight line, circular holes 801-804 communicate with each other to form a long-strip vent hole 810.

Subsequent passivation treatment may be performed on the inner wall surface of the vent hole 810, such as forming a passivation layer or performing a grinding layer process, such that the inner wall surface of the vent hole 810 is smoother and free of sharp protrusions.

The passivation process may be a metallization process. In one embodiment, the metallization process includes: forming a metal layer on the inner wall surface of the formed vent hole 810 and the surface of the substrate 800 by, for example, Sputtering process, Plating process, or Metal Vapor Deposition (MOCVD) process; the metal layer on the surface of the substrate 800 is then removed by methods such as grinding or etching, leaving only the metal layer covering the inner wall of the vent hole 810 as a passivation layer. If, after grinding or etching, the thickness of the metal layer covered within the vent hole 810 is too large, it can be re-drilled by using a drill with a smaller aperture, only leaving a thinner metal layer as the passivation layer. Wherein, the material for the metal layer may be metal materials commonly used in semiconductor processes, such as W or Cu.

An implementation of the disclosure also provides a package structure employing the package substrate described above.

Figure 9:
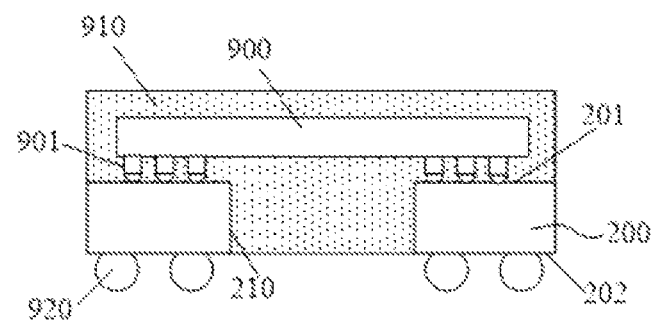
FIG. 9 is a schematic illustration of a packaging structure according to an embodiment of the present disclosure.

Referring now to FIG. 9, a schematic illustration of a packaging structure in accordance with a specific implementation of the present disclosure is shown.

In this particular implementation, the package substrate described in FIG. 2*b* is taken as an example.

The packaging structure includes a package substrate including a substrate 200 and a vent hole 210 extending through the substrate 200; a chip 900 flip-chip fixed on the first surface 201 of the substrate 200 by solder bumps 901, forming electrical connections between the solder bumps 901 and the substrate 200, the vent hole 210 being located within a projection of the chip 900 on the substrate 200; a mold compound 910, enclosing the chip 900 and filling the gap between the chip 900 and the first surface 201 of the substrate 200 and the vent hole 210.

The vent hole 210 in the package is long-strip hole extending through the first surface 201 and the second surface 202 of the substrate 200.

The packaging structure also includes solder balls 920 formed on the second surface 202 of the substrate 200.

In the above-described package structure, since the long-strip vent holes are formed in the package substrate, the filling effect of the mold compound 910 can be effectively improved in various directions, such that the mold compound 910 sufficiently fills the gap between the chip 900 and the substrate 200, reducing problems of poor filling such as air holes etc., and improving the reliability of the package structure.

The vent holes within the package substrate of the package structure can also adopt other configurations, with specific reference to the descriptions in the preceding detailed description, which are not repeated here.

Embodiments of the present disclosure also provide a method of forming the package structure described above.

The method of forming the package structure comprises the steps of:

Step 1: providing a package substrate having opposing first surface and second surface; at least one vent hole extending through the first surface and the second surface of the substrate, the vent hole comprising at least a long-strip hole.

Step 2: flip-chip fixing a chip on a first surface of the substrate with solder bumps by a flip chip process, forming electrical connections between the solder bumps and the substrate, the vent hole within the substrate being located within a projection of the chip on the substrate.

Step 3: performing a injection molding process of the chip flip-chip onto the substrate, enclosing the chip and filling the gap between the chip and the first surface of the substrate and the vent hole with a mold compound.

A substrate with a flip chip on the surface can be placed within a cavity of the injection mold, and a second surface of the substrate is located on the bottom surface of the cavity; then, a liquid mold compound is injected into the cavity and curing process is performed, the mold compound fills the cavity, encloses the chip, and fills the chip-to-substrate surface gap.

During injection of the mold compound, gas within the cavity is vented through at least some of the vent holes. The cavity bottom can have grooves in communication with vent holes in the substrate, the grooves are communicated with the outside of the packaging mold to vent gas out of the cavity.

Since the vent holes comprise long-strip holes, the vent holes are not easy to be blocked, and have a large aperture, the venting efficiency is improved. Therefore, it may continue to serve as a gas venting channel before the mold compound completely fills the cavity, enhancing the filling effect of the mold compound.

Step 4: forming solder balls on the second surface of the substrate.

After the injection molding process is completed, solder balls, which may be soldering lead tin balls or lead-free tin balls, etc., are formed on the second surface of the substrate. The package structure may be subsequently affixed to other electronic components, such as other circuit boards through the solder balls via a reflow soldering process.

What has been described above is merely the preferred embodiments of the present disclosure, and it should be noted that numerous modifications and modifications can be made to those skilled in the art without departing from the principles of the disclosure, which are also to be regarded as protective in the scope of the disclosure.

What is claimed is:

1. A package substrate, comprising:
   a substrate, comprising a first surface and a second surface opposite to the first surface;
   at least one vent hole, extending through the first surface and the second surface of the substrate, the at least one vent hole comprising at least one long-strip hole;

wherein an inner wall of each of the at least one vent hole has a passivation surface.

2. The package substrate of claim 1, wherein the each of the at least one vent hole comprises at least two cross-connected long-strip holes.

3. The package substrate of claim 1, wherein the at least one vent hole comprises more than two vent holes uniformly distributed in a length direction of the package substrate.

4. The package substrate of claim 1, wherein the each of the at least one vent hole is symmetric about an axis of symmetry of the package substrate.

5. The package substrate of claim 1, wherein a cross-sectional edge of the each of the at least one vent hole parallel to a surface of the substrate is a smooth line.

6. The package substrate of claim 1, wherein each of the at least one long-strip hole is formed by connecting a plurality of continuous circular holes.

7. The package substrate of claim 1, wherein each of the at least one long-strip hole has a width to length ratio ranging from 1:1.3 to 1:15.

8. The package substrate of claim 1, further comprising:
at least one circular hole, distributed across a central axis of the substrate.

9. A method of forming a package substrate, comprising:
providing a substrate, the substrate comprising a first surface and a second surface;
forming at least one vent hole, the at least one vent hole extending through the first surface and the second surface of the substrate, the at least one vent hole comprising at least one long-strip hole; and
performing a passivation process on an inner wall surface of each of the at least one vent hole.

10. The method of forming a package substrate of claim 9, wherein the each of the at least one vent hole comprises at least two cross-connected long-strip holes.

11. The method of forming a package substrate of claim 9, wherein the at least one vent hole comprises more than two vent holes uniformly distributed in a length direction of the package substrate.

12. The method of forming a package substrate of claim 9, wherein the each of the at least one vent hole is symmetric about an axis of symmetry of the package substrate.

13. The method of forming a package substrate of claim 9, wherein a cross-sectional edge of the each of the at least one vent hole parallel to a surface of the substrate is a smooth line.

14. The method of forming a package substrate of claim 9, wherein each of the at least one long-strip hole is formed by forming a plurality of continuous circular holes through the substrate, and the plurality of continuous circular holes are interconnected to Conn the each of the at least one long-strip bole.

15. The method of forming a package substrate of claim 9, wherein each of the at least one long-strip hole has a width to length ratio ranging from 1:1.3 to 1:15.

16. The method of forming a package substrate of claim 9, further comprising:
forming at least one circular hole distributed across a central axis of the substrate.

17. A package structure, comprising:
the package substrate of claim 1;
a chip, flip-chip fixed on the first surface of the substrate through solder bumps and electrically connected with the substrate through the solder bumps, the at least one vent hole being located within a projection of the chip on the substrate; and
a mold compound enclosing the chip and filling a gap between the chip and the first surface of the substrate and the at least one vent hole.

18. A method of forming a package structure, comprising:
providing the package substrate of claim 1;
flip-chip fixing a chip on the first surface of the substrate through solder bumps by a flip-chip process, the chip being electrically connected with the substrate through the solder bumps, the at least one vent hole within the substrate being located within a projection of the chip on the substrate; and
performing an injection molding process on the chip flipped onto the substrate, enclosing the chip and filling a gap between the chip and the first surface of the substrate and the at least one vent hole with a mold compound.

* * * * *